(12) United States Patent
Yang

(10) Patent No.: US 11,621,238 B2
(45) Date of Patent: Apr. 4, 2023

(54) SEMICONDUCTOR DEVICE WITH REDISTRIBUTION PATTERN AND METHOD FOR FABRICATING THE SAME

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 158 days.

(21) Appl. No.: 17/235,571

(22) Filed: Apr. 20, 2021

(65) Prior Publication Data

US 2022/0336388 A1 Oct. 20, 2022

(51) Int. Cl.
*H01L 23/00* (2006.01)
*H01L 23/522* (2006.01)
*H01L 25/065* (2023.01)

(52) U.S. Cl.
CPC .......... *H01L 24/04* (2013.01); *H01L 23/5226* (2013.01); *H01L 24/32* (2013.01);
(Continued)

(58) Field of Classification Search
CPC ..... H01L 24/04; H01L 23/5226; H01L 24/32; H01L 24/48; H01L 24/73; H01L 25/0655; H01L 25/0657; H01L 2224/02372; H01L 2224/02373; H01L 2224/32225; H01L 2224/48227; H01L 2224/73215; H01L 2224/73265; H01L 2225/0651; H01L 24/03; H01L 23/5286; H01L 24/05; H01L 24/29; H01L 24/45; H01L 24/85; H01L 24/92; H01L 24/06; H01L 2224/04042; H01L 2224/05569; H01L 2224/06138; H01L 2224/06515; H01L 2224/2929; H01L 2224/32145; H01L 2224/45144; H01L 2224/48091; H01L 2224/48465; H01L 2224/48472; H01L 2224/83862;
(Continued)

(56) References Cited

U.S. PATENT DOCUMENTS

| 2004/0056355 | A1  | 3/2004 | Minami et al. |
| 2006/0001101 | A1* | 1/2006 | Hirata ..................... H01L 24/06 257/355 |

(Continued)

*Primary Examiner* — Elias Ullah
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a first substrate including a center region and an edge region distal from the center region, a first circuit layer positioned on the first substrate, a center power pad positioned in the first circuit layer and above the center region, an edge power pad positioned in the first circuit layer, above the edge region, and electrically coupled to the center power pad, a redistribution power pattern positioned above the first circuit layer and electrically coupled to the center power pad, and an edge power via positioned between the edge power pad and the redistribution power pattern, and electrically connecting the edge power pad and the redistribution power pattern. The first substrate, the center power pad, the edge power pad, the redistribution power pattern, and the edge power via together configure a first semiconductor die.

13 Claims, 16 Drawing Sheets

(52) U.S. Cl.
CPC .............. *H01L 24/48* (2013.01); *H01L 24/73* (2013.01); *H01L 25/0655* (2013.01); *H01L 25/0657* (2013.01); *H01L 2224/02372* (2013.01); *H01L 2224/02373* (2013.01); *H01L 2224/32225* (2013.01); *H01L 2224/48227* (2013.01); *H01L 2224/73215* (2013.01); *H01L 2224/73265* (2013.01); *H01L 2225/0651* (2013.01)

(58) Field of Classification Search
CPC . H01L 2224/85203; H01L 2224/85205; H01L 2224/85207; H01L 2224/92247; H01L 2924/15311; H01L 2924/181
See application file for complete search history.

(56) References Cited

U.S. PATENT DOCUMENTS

| | | |
|---|---|---|
| 2010/0025859 A1 | 2/2010 | Inoue |
| 2019/0074834 A1 | 3/2019 | Sato |

* cited by examiner

SEMICONDUCTOR DEVICE WITH REDISTRIBUTION PATTERN AND METHOD FOR FABRICATING THE SAME

TECHNICAL FIELD

The present disclosure relates to a semiconductor device and a method for fabricating the semiconductor device, and more particularly, to a semiconductor device with redistribution pattern.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first substrate including a center region and an edge region distal from the center region, a first circuit layer positioned on the first substrate, a center power pad positioned in the first circuit layer and above the center region, an edge power pad positioned in the first circuit layer, above the edge region, and electrically coupled to the center power pad, a redistribution power pattern positioned above the first circuit layer and electrically coupled to the center power pad, and an edge power via positioned between the edge power pad and the redistribution power pattern, and electrically connecting the edge power pad and the redistribution power pattern. The first substrate, the center power pad, the edge power pad, the redistribution power pattern, and the edge power via together configure a first semiconductor die.

In some embodiments, the redistribution power pattern including a redistribution center power pad positioned above the first circuit layer, topographically aligned with the center power pad, and electrically coupled to the center power pad, a redistribution edge power pad positioned above the first circuit layer, topographically aligned with the edge power pad, and electrically coupled to the edge power pad through the edge power via, and a redistribution connection line connecting the redistribution center power pad and the redistribution edge power pad.

In some embodiments, the semiconductor device includes an assisted power pad and an assisted via. The assisted power pad is positioned in the first circuit layer, positioned between the center power pad and the edge power pad, and electrically coupled to the center power pad. The assisted via electrically connects the redistribution connection line and the assisted power pad.

In some embodiments, the semiconductor device includes a lower passivation layer positioned on the first circuit layer. The edge power via and the assisted via are positioned in the lower passivation layer.

In some embodiments, the semiconductor device includes an upper passivation layer positioned on the lower passivation layer. The redistribution power pattern is positioned in the upper passivation layer.

In some embodiments, the semiconductor device includes a package substrate positioned below the first substrate.

In some embodiments, the semiconductor device includes a first attachment layer positioned between the package substrate and the first substrate and connecting the package substrate and the first substrate.

In some embodiments, the semiconductor device includes a wire electrically connecting the redistribution edge power pad and a conductive line in the package substrate.

In some embodiments, the redistribution edge power pad is electrically coupled to an external power source.

In some embodiments, the semiconductor device includes a center data pad and a redistribution data pattern. The center data pad is positioned in the first circuit layer and above the center region. The redistribution data pattern includes a redistribution center data pad positioned on the lower passivation layer, topographically aligned with the center data pad, and electrically coupled to the center data pad through a center data via, a redistribution edge data pad positioned on the lower passivation layer and above the edge region, and a redistribution data line connecting the redistribution center data pad and the redistribution edge data pad.

In some embodiments, a width of the redistribution connection line is greater than a width of the redistribution data line.

In some embodiments, the semiconductor device includes a cushion layer positioned in the first circuit layer and topographically aligned with the edge power pad.

In some embodiments, the semiconductor device includes a second semiconductor die positioned next to the first semiconductor die. The second semiconductor die is attached on the package substrate through a first attachment layer.

In some embodiments, the semiconductor device includes a second semiconductor die stacked on the first semiconductor die with a second attachment layer interposed therebetween.

In some embodiments, a layout of the second semiconductor die and a layout of the first semiconductor die are substantially the same.

Another aspect of the present disclosure provides a method for fabricating a semiconductor device including providing a first substrate including a center region and an edge region distal from the center region, forming a first circuit layer on the first substrate, forming a center power pad in the first circuit layer and above the center region, forming an edge power pad in the first circuit layer, above the edge region, and electrically coupled to the center power pad, forming an edge power via on the edge power pad, and forming a redistribution power pattern on the edge power via and electrically coupled to the center power pad. The first substrate, the center power pad, the edge power pad, the redistribution power pattern, and the edge power via together configure a first semiconductor die.

In some embodiments, the redistribution power pattern including a redistribution center power pad above the first circuit layer, topographically aligned with the center power pad, and electrically coupled to the center power pad, a redistribution edge power pad above the first circuit layer, topographically aligned with the edge power pad, and electrically coupled to the edge power pad through the edge power via, and a redistribution connection line connecting the redistribution center power pad and the redistribution edge power pad.

In some embodiments, the method for fabricating the semiconductor device includes attaching the first semiconductor die to a package substrate through a first attachment layer.

In some embodiments, the method for fabricating the semiconductor device includes forming a wire electrically coupling the redistribution edge power pad and a conductive line in the package substrate.

In some embodiments, the method for fabricating the semiconductor device includes forming a conductor below the package substrate and electrically connecting the conductive line in the package substrate.

Due to the design of the semiconductor device of the present disclosure, the insufficiency of power delivery may be alleviated by the edge power via and the assisted via. As a result, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
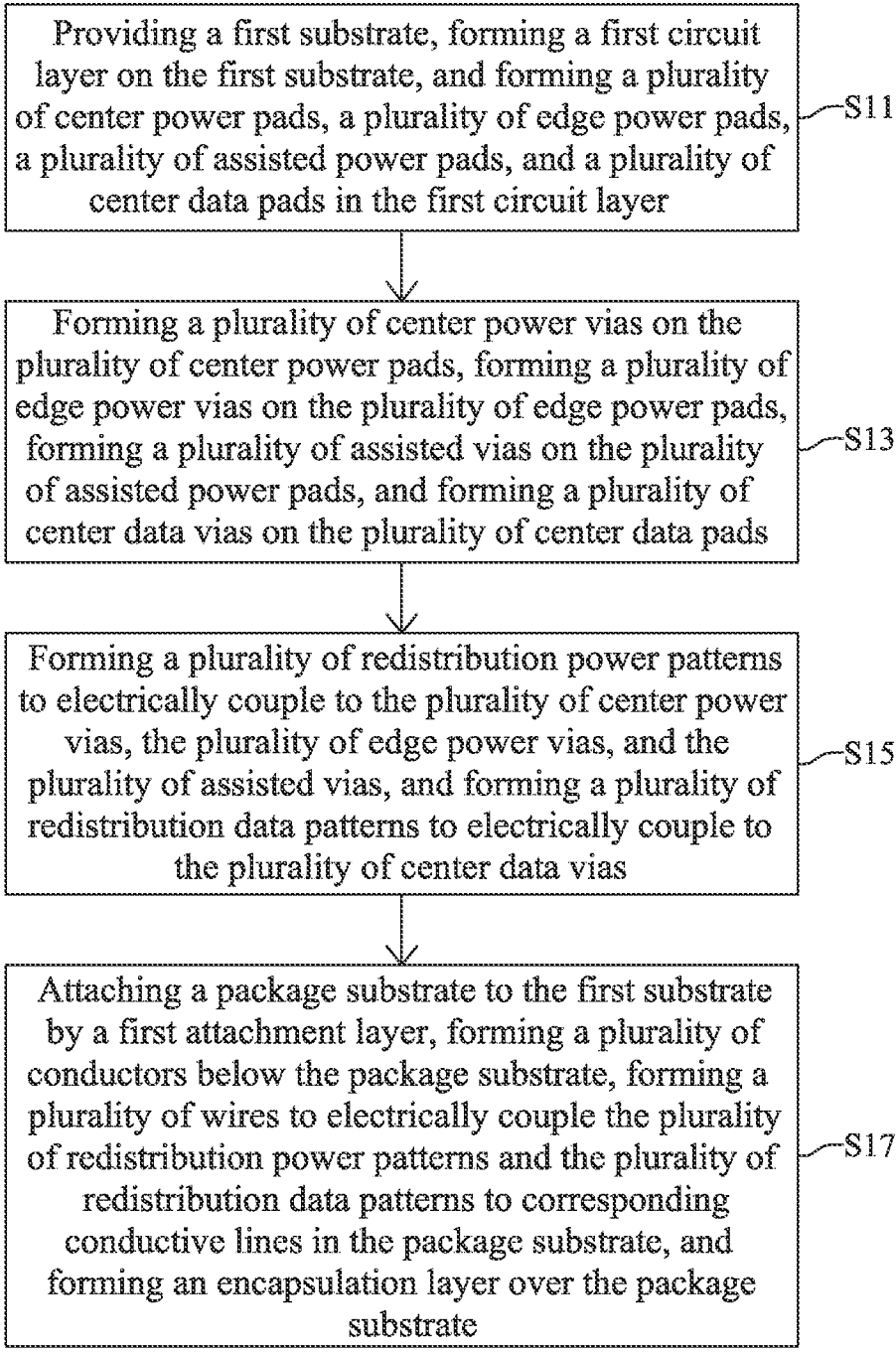
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

In the description of the present disclosure, an X-Y-Z coordinate system is assumed where X and Y refer to dimensions within the plane parallel to the major surface of the structure and Z refers a dimension perpendicular to the plane, two features are topographically aligned when those features have substantially the same X, Y coordinates.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

Figure 2:
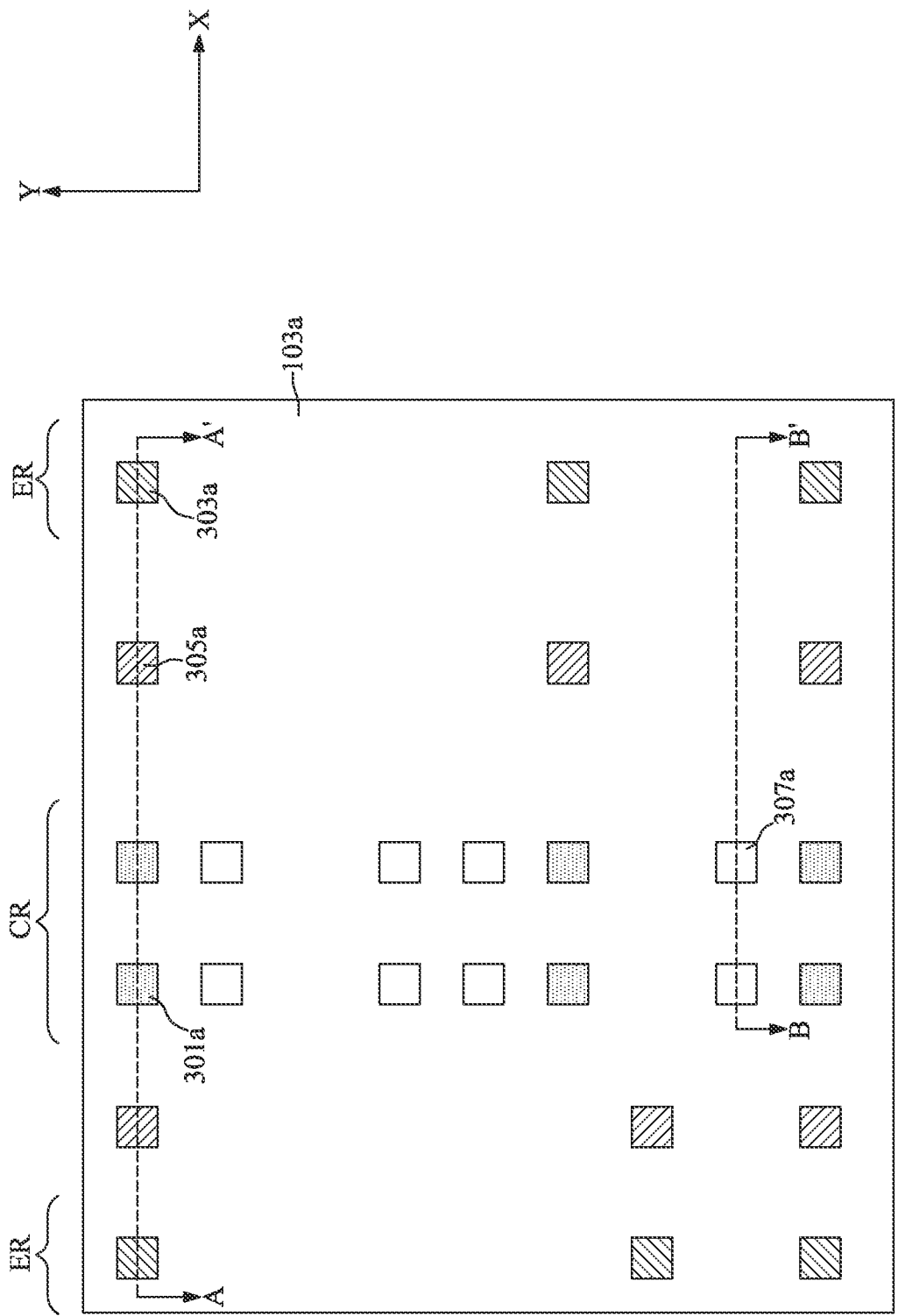
FIG. 2 illustrates, in a schematic top-view diagram, an intermediate semiconductor device in accordance with one embodiment of the present disclosure.
Figure 3:
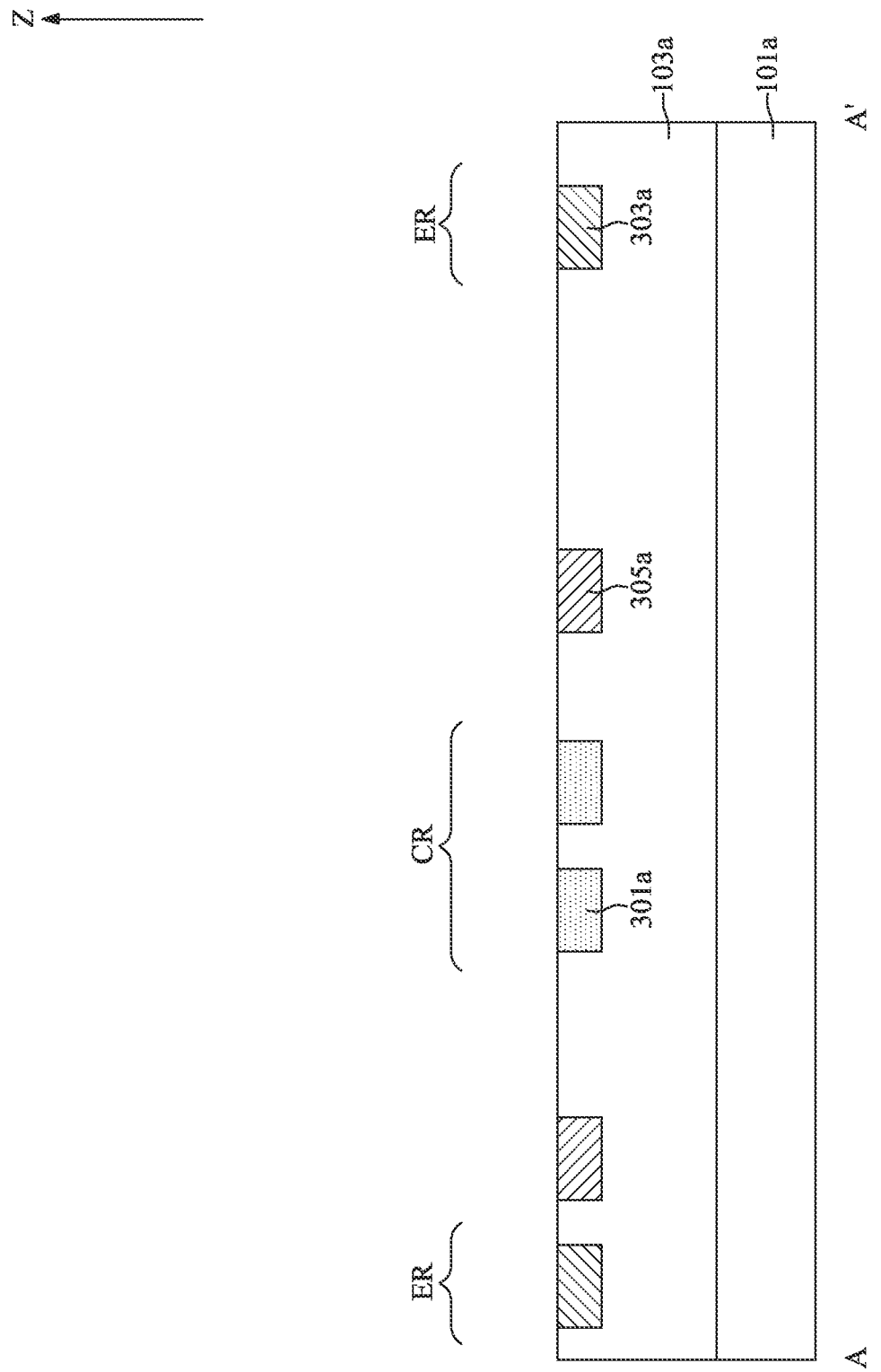
FIGS. 3 and 4 are schematic cross-sectional view diagrams taken along lines A-A' and B-B' in FIG. 2.
Figure 4:
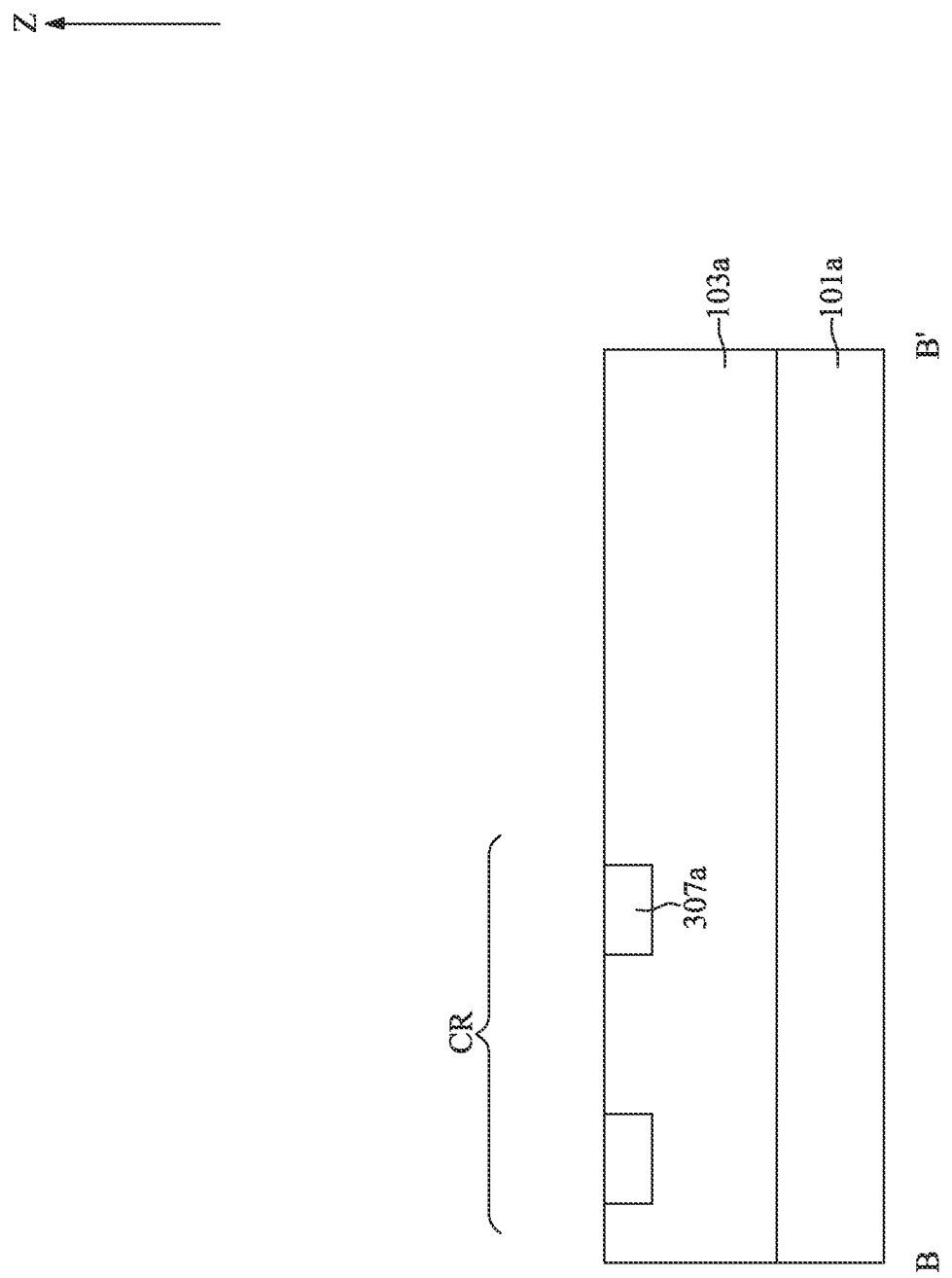
Figure 5:
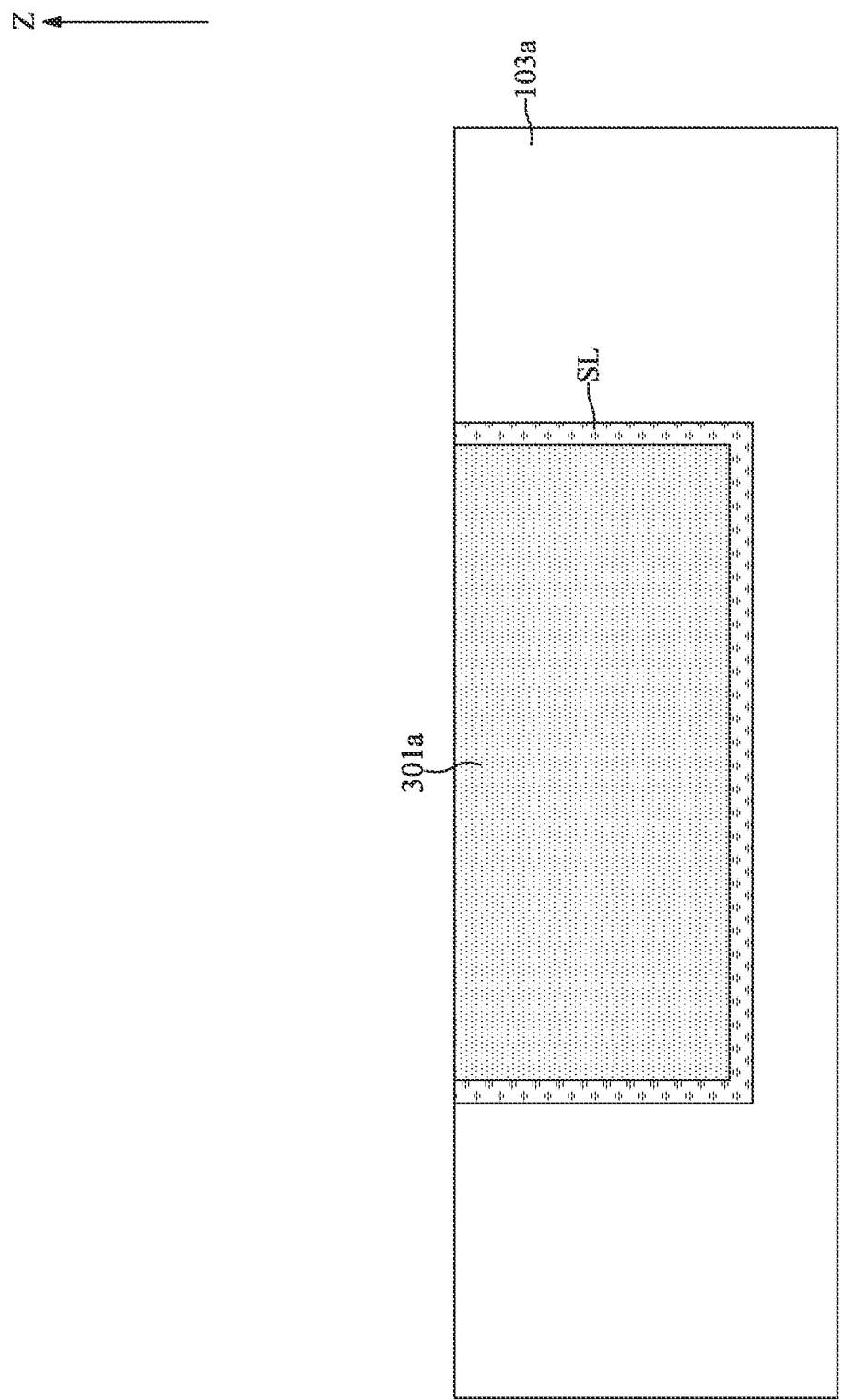
FIG. 5 illustrates, in a close-up schematic cross-sectional view diagram, an intermediate semiconductor device in accordance with one embodiment of the present disclosure.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIGS. 3 and 4 are schematic cross-sectional view diagrams taken along lines A-A' and B-B' in FIG. 2. FIG. 5 illustrates, in a close-up schematic cross-sectional view diagram, an intermediate semiconductor device in accordance with one embodiment of the present disclosure.

With reference to FIGS. 1 to 5, at step S11, a first substrate 101a may be provided, a first circuit layer 103a may be formed on the first substrate 101a, a plurality of center power pads 301a, a plurality of edge power pads 303a, a plurality of assisted power pads 305a, and a plurality of center data pads 307a may be formed in the first circuit layer 103a.

With reference to FIGS. 2 to 4, the first substrate 101a may be a bulk semiconductor substrate. The bulk semiconductor substrate may be formed of, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VI compound semiconductor.

In some embodiments, the first substrate 101a may include a semiconductor-on-insulator structure which consisting of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. The insulator layer may have a thickness between about 10 nm and about 200 nm.

It should be noted that, the term "about" modifying the quantity of an ingredient, component, or reactant of the present disclosure refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

In some embodiments, the first substrate 101a may include a center region CR and two opposite edge regions ER. The center region CR may be a region between the two opposite edge regions ER. The two opposite edge regions ER may be located on two sides of the first substrate 101a and along the Y dimension in a top-view perspective. In other words, the two opposite edge regions ER may near two edges of the first substrate 101a or near the scribe lines.

It should be noted that the center region CR may comprise a portion of the first substrate 101a and a space above the portion of the first substrate 101a. Describing an element as being disposed on the center region CR means that the element is disposed on a top surface of the portion of the first substrate 101a. Describing an element as being disposed in the center region CR means that the element is disposed in the portion of the first substrate 101a; however, a top surface of the element may be even with the top surface of the portion of the first substrate 101a. Describing an element as being disposed above the center region CR means that the element is disposed above the top surface of the portion of the first substrate 101a. Accordingly, the edge region ER may comprise another portion of the first substrate 101a and a space above the other portion of the first substrate 101a.

With reference to FIGS. 2 to 4, the first circuit layer 103a may be formed on the first substrate 101a. The first circuit layer 103a may include inter-layer dielectric layers and/or inter-metal dielectric layers containing a plurality of functional blocks (not shown for clarity) and a plurality of conductive features (not shown for clarity). The plurality of functional blocks may be transistors such as complementary metal-oxide-semiconductor transistors, metal-oxide-semiconductor field-effect transistors, fin field-effect-transistors, the like, or a combination thereof. The plurality of functional blocks may cooperate together and provide a variety of functionalities such as logic, I/O, memory, analog circuits, and the like.

The plurality of conductive features may include a plurality of conductive plugs, a plurality of conductive lines, a plurality of conductive vias, and a plurality of conductive pads, or other suitable conductive elements. The plurality of conductive plugs may be physically and electrically coupled to the plurality of functional blocks. The plurality of conductive lines may be separated from each other and may be horizontally disposed in the inter-layer dielectric layers and/or inter-metal dielectric layers along the Z dimension. In the description of the present disclosure, the topmost conductive lines may be designated as the plurality of conductive pads. The top surfaces of plurality of conductive pads may be substantially coplanar with the top surface of the first circuit layer 103a. The plurality of conductive vias may connect adjacent conductive lines along the Z dimension. In some embodiments, the plurality of conductive vias may improve heat dissipation in the first circuit layer 103a and may provide structure support in the first circuit layer 103a.

The inter-layer dielectric layers and/or the inter-metal dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The inter-layer dielectric layers and/or the inter-metal dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps. The plurality of functional blocks and the plurality of conductive features may be formed during the formation of the inter-layer dielectric layers and/or the inter-metal dielectric layers.

The plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIGS. 2 to 4, the plurality of center power pads 301a may be formed in the first circuit layer 103a and above the center region CR. The plurality of center power pads 301a may be substantially coplanar with the top surface of the first circuit layer 103a. In some embodiments, the plurality of center power pads 301a may be arranged in two columns which are parallel with the Y dimension in a top-view perspective.

With reference to FIGS. 2 to 4, the plurality of edge power pads 303a may be formed in the first circuit layer 103a and above the two opposite edge regions ER. The plurality of edge power pads 303a may be substantially coplanar with the top surface of the first circuit layer 103a. In some embodiments, the plurality of edge power pads 303a may be arranged in two columns which are parallel with the Y dimension in a top-view perspective. One of the two columns may be arranged above one of the two opposite edge regions ER and the other one of the two columns may be arranged above the other one of the two opposite edge regions ER.

With reference to FIGS. 2 to 4, the plurality of assisted power pads 305a may be formed in the first circuit layer 103a and above the two regions between the center region CR and the two opposite edge regions ER. The plurality of assisted power pads 305a may be substantially coplanar with the top surface of the first circuit layer 103a. In some embodiments, the plurality of assisted power pads 305a may be arranged in two columns which are parallel with the Y dimension in a top-view perspective. The two columns may be opposite to each other with the plurality of center power pads 301a interposed therebetween.

With reference to FIGS. 2 to 4, the plurality of center data pads 307a may be formed in the first circuit layer 103a and above the center region CR. The plurality of center data pads 307a may be substantially coplanar with the top surface of the first circuit layer 103a. In some embodiments, the plurality of center data pads 307a may be arranged in two columns which are parallel with the Y dimension in a top-view perspective.

In some embodiments, the plurality of center power pads 301a, the plurality of edge power pads 303a, the plurality of assisted power pads 305a, the plurality of assisted power pads 305a, and the plurality of center data pads 307a may be electrically coupled to the plurality of functional blocks, respectively and correspondingly.

For brevity, clarity, and convenience of description, only one plurality of center power pad 301a is described.

In some embodiments, a pad opening (not shown) may be formed in the first circuit layer 103a and a conductive material may be formed to fill the pad opening to form the center power pad 301a. The pad opening may be formed by a photolithography process and a subsequent etching process. A portion of the top surface of the topmost conductive feature may be exposed through the pad opening.

In some embodiments, the etching process may be an anisotropic dry etching process using argon and tetrafluoromethane as etchants. The process temperature of the etching process may be between about 120° C. and about 160° C. The process pressure of the etching process is between about 0.3 Torr and about 0.4 Torr. The process duration of the etching process may be between about 33 and about 39 seconds. Alternatively, in some embodiments, the etching process may be an anisotropic dry etching process using helium and nitrogen trifluoride as etchants. The process temperature of the etching process may be between about 80° C. and about 100° C. The process pressure of the etching process is between about 1.2 Torr and about 1.3 Torr. The process duration of the etching process may be between about 20 seconds and about 30 seconds.

In some embodiments, a cleaning process may be performed after the formation of the pad opening. The cleaning process may include applying a mixture of hydrogen and argon as a remote plasma source with a process temperature between about 250° C. and about 350° C. and a process pressure ranging between about 1 Torr and about 10 Torr in the presence of a bias energy applied to the equipment performing the cleaning process. The bias energy may be between about 0 W and 200 W. The cleaning process may remove oxide, originating from oxidation by oxygen in the air, from the top surface of the topmost conductive feature exposed through the pad opening without damaging the topmost conductive feature.

A passivation process may be subsequently performed over the first circuit layer 103a and the pad opening. The passivation process may include soaking the intermediate semiconductor device with a precursor such as dimethylaminotrimethylsilane, tetramethylsilane, or the like at a process temperature between about 200° C. and about 400° C. An ultraviolet radiation may be used to facilitate the passivation process. The passivation process may passivate sidewalls of the first circuit layer 103a exposed through the pad opening by sealing surface pores thereof to reduce undesirable sidewall growth, which may affect the electric characteristics of the semiconductor device 1A, during subsequent processing steps. As a result, the performance and reliability of the semiconductor device 1A may be increased.

In some embodiments, the pad opening may be sequentially filled with the conductive material by sputtering, electroplating, or electroless plating. For example, when the pad opening is filled by sputtering using an aluminum-copper material as source, the process temperature of sputtering may be between about 100° C. and about 400° C. The process pressure of sputtering may be between about 1 mTorr and about 100 mTorr. After sputtering, an etching process may be performed to trim the filled conductive material to form the center power pad 301a. The etching process may use chlorine and argon as etchants. The etchant flow of chlorine may be between about 10 sccm (standard cubic centimeters to minute) and about 30 sccm. The etchant flow of argon may be between about 900 sccm and about 1100 sccm. The process temperature of the etching process may be between about 50° C. and about 200° C. The process pressure of the etching process may be between about 50 mTorr and about 10 Torr. The process duration of the etching process may be between about 30 seconds and about 200 seconds. In this example, the center power pad 301a may have a thickness between about 400 nm and about 1100 nm and the center power pad 301a may be formed of aluminum-copper alloy. Small quantities of copper in aluminum may improve the electromigration resistance and further reduce the occurrence of hillocks, that is small protrusions of aluminum on a surface of a thin film layer of aluminum.

For another example, the pad opening may be filled by an electroplating process using a plating solution. The plating solution may include copper sulfate, copper methane sulfonate, copper gluconate, copper sulfamate, copper nitrate, copper phosphate, or copper chloride. The pH of the plating solution may be between about 2 and about 6 or between about 3 and about 5. The process temperature of the electroplating process may be maintained between about 40° C. and about 75° C. or between about 50° C. and about 70° C. In this example, the center power pad 301a may be formed of copper.

In some embodiments, the plating solution may include accelerators, suppressors, or levelers. The accelerators may include a polar sulfur, oxygen, or nitrogen functional group that help to increase deposition rates and may promote dense nucleation. The accelerators may be present at a low concentration level, for example, between about 0 and about 200 ppm. The suppressors are additives that reduce the plating rate and are usually present in the plating bath at higher concentrations, for example, between about 5 ppm and about 1000 ppm. The suppressors may be polymeric surfactants with high molecular weight, such as polyethylene glycol.

The suppressors may slow down the deposition rate by adsorbing on the surface and forming a barrier layer to the copper ions. Because of their large size and low diffusion rate, the suppressors are less likely to reach the lower part of the pad opening. Therefore, most of the suppressing effect may occur at the upper part of the pad opening, helping to reduce overburden of the filling material (e.g., copper) and avoid the pad opening "closing".

The leveler may be used to improve filling performance, decrease the surface roughness, and prevent copper deposition at the upper part of the pad opening. The levelers may be present in a small concentration, for example, between about 1 ppm and about 100 ppm. The levelers may be, for example, 3-mercapto-1-propanesulfonate, (3-sulfopropyl) disulfide, or 3,3-thiobis (1-propanesulfonate).

In some embodiments, the center power pad 301a may include a bottom portion and a top portion. The bottom portion may be formed on the lower part of the pad opening. The top portion may be formed on the bottom portion and completely filled the pad opening. The bottom portion may include nickel. The top portion may include palladium, cobalt, or a combination thereof.

In some embodiments, the layer of first circuit layer 103a where the center power pad 301a disposed may be formed of a polymeric material such as polybenzoxazole, polyimide, benzocyclobutene, ajinomoto buildup film, solder resist film, or the like. The polymeric material (e.g., polyimide) may have a number of attractive characteristics such as the ability to fill openings of high aspect ratio, a relatively low dielectric constant (about 3.2), a simple depositing process, the reduction of sharp features or steps in the underlying layer, and high temperature tolerance after curing. In addition, some photosensitive polymeric material (e.g., photosensitive polyimide) may have all aforementioned characteristics and may be patterned like a photoresist mask and may, after patterning and etching, remain on the surface on which the photosensitive polymeric material has been deposited to serve as part of a passivation layer.

The plurality of edge power pads 303a, the plurality of assisted power pads 305a, the plurality of assisted power pads 305a, and the plurality of center data pads 307a may be formed concurrently with the center power pad 301a, and descriptions thereof are not repeated herein.

In some embodiments, the plurality of center power pads 301a may act as connection members that electrically connect the semiconductor device 1A to an external device.

With reference to FIG. 5, in some embodiments, a seed layer SL may be formed between the first circuit layer 103a and the center power pad 301a. The seed layer SL may have a U-shaped cross-sectional profile. The seed layer may include, for example, copper.

Figure 6:
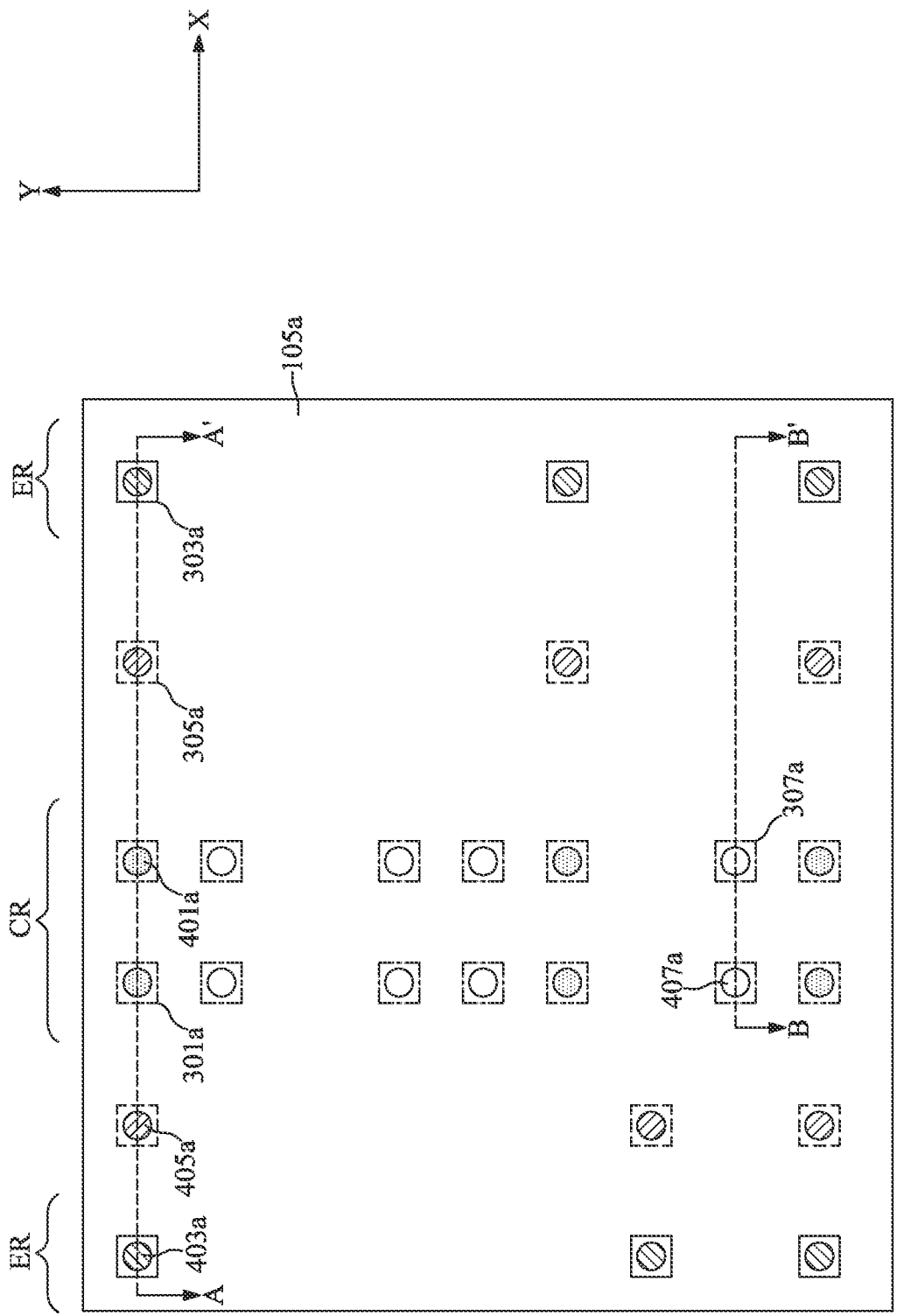
FIG. 6 illustrates, in a schematic top-view diagram, an intermediate semiconductor device in accordance with one embodiment of the present disclosure.
Figure 7:
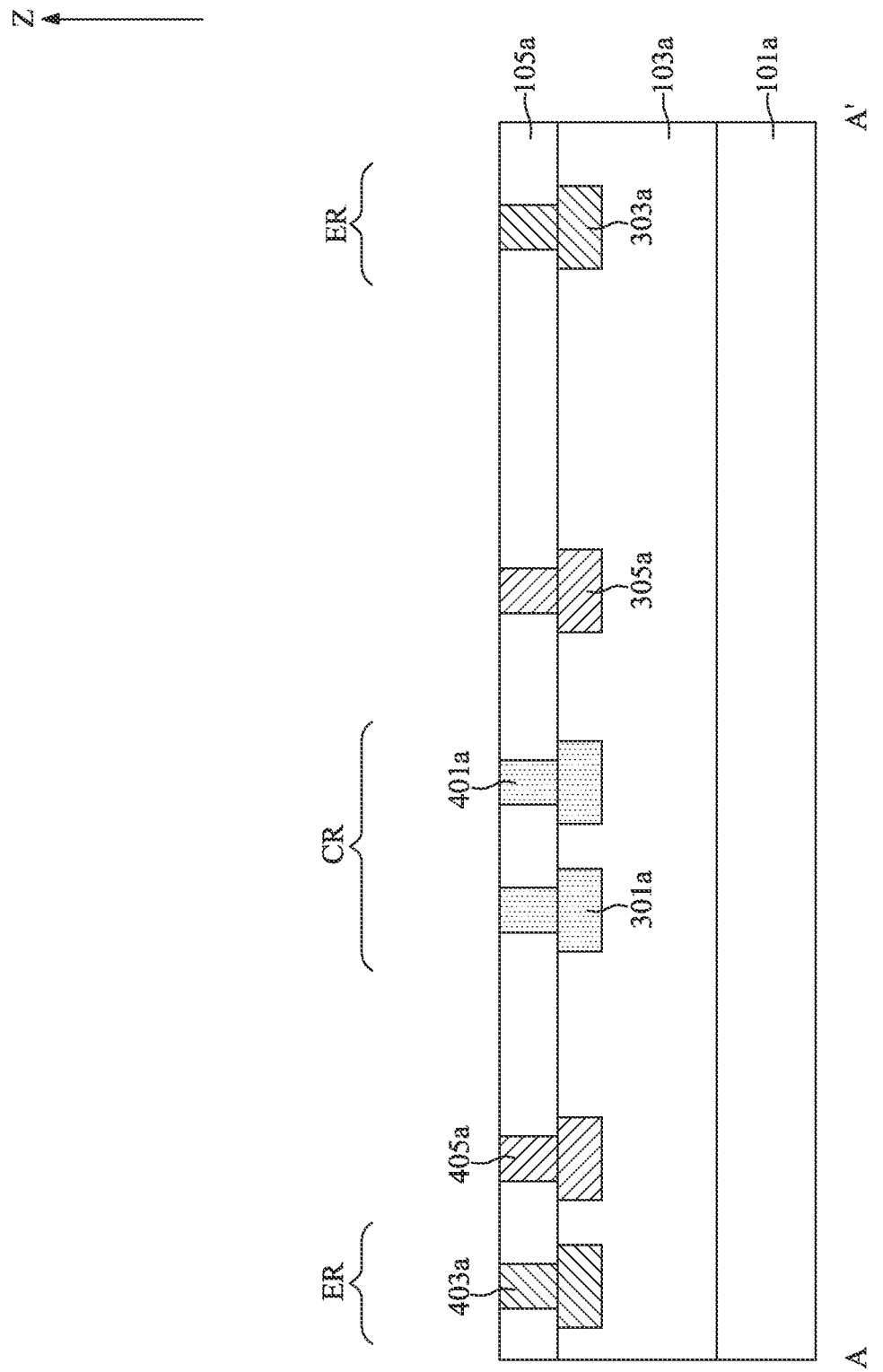
FIGS. 7 and 8 are schematic cross-sectional view diagrams taken along lines A-A' and B-B' in FIG. 6.
Figure 8:
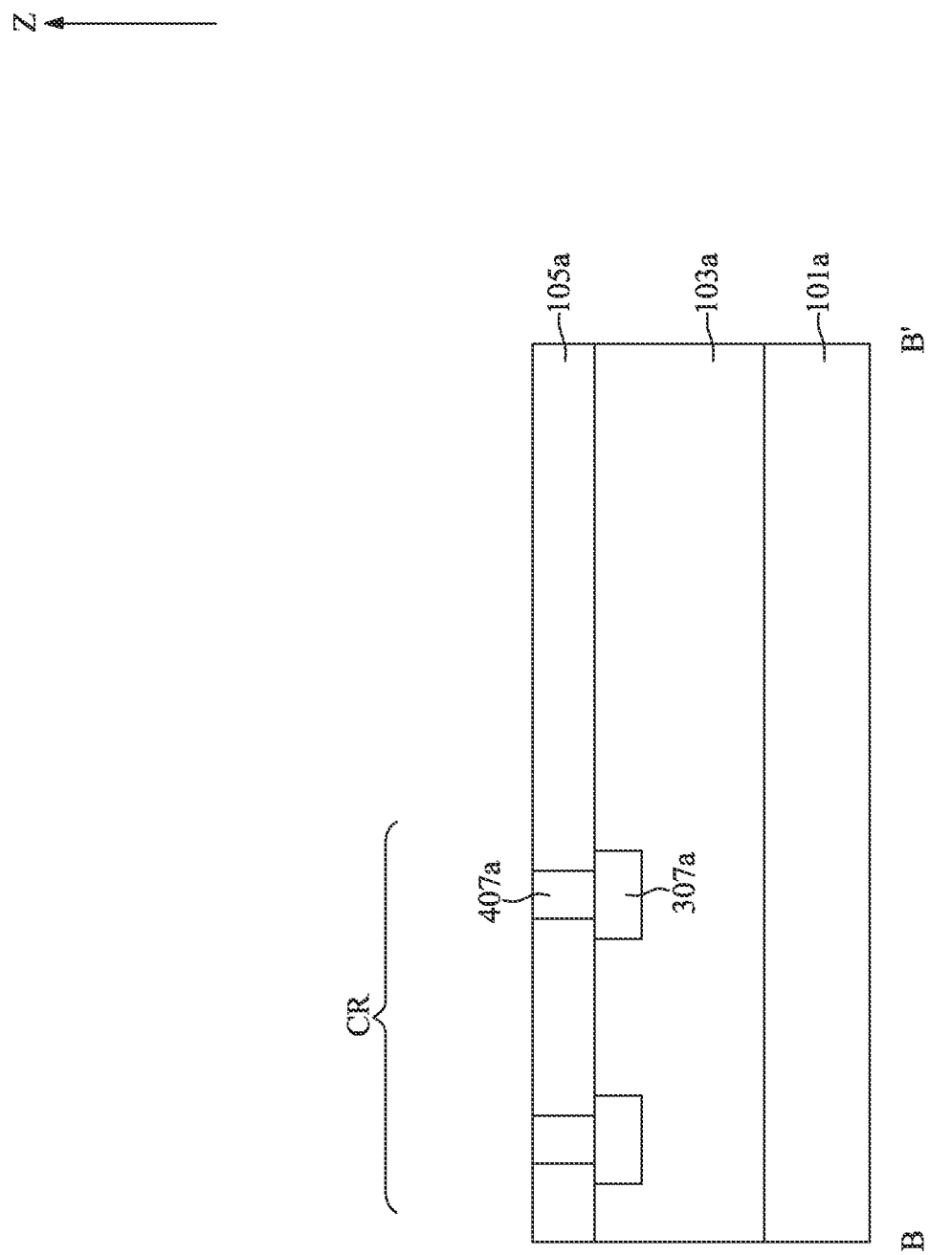

FIG. 6 illustrates, in a schematic top-view diagram, an intermediate semiconductor device in accordance with one embodiment of the present disclosure. FIGS. 7 and 8 are schematic cross-sectional view diagrams taken along lines A-A' and B-B' in FIG. 6.

With reference to FIG. 1 and FIGS. 6 to 8, at step S13, a plurality of center power vias 401a may be formed on the plurality of center power pads 301a, a plurality of edge power vias 403a may be formed on the plurality of edge power pads 303a, a plurality of assisted vias 405a may be formed on the plurality of assisted power pads 305a, and a plurality of center data vias 407a may be formed on the plurality of center data pads 307a.

With reference to FIGS. 6 to 8, a lower passivation layer 105a may be formed on the first circuit layer 103a. In some embodiments, the lower passivation layer 105a may include polybenzoxazole, polyimide, benzocyclobutene, ajinomoto buildup film, solder resist film, the like, or a combination thereof. The lower passivation layer 105a formed of polymeric material may have a number of attractive characteristics such as the ability to fill openings of high aspect ratio, a relatively low dielectric constant (about 3.2), a simple depositing process, the reduction of sharp features or steps in the underlying layer, and high temperature tolerance after curing. In some other embodiments, the lower passivation layer 105a may be a dielectric layer. The dielectric layer may include a nitride such as silicon nitride, an oxide such as silicon oxide, an oxynitride such as silicon oxynitride, silicon nitride oxide, phosphosilicate glass, borosilicate glass, boron-doped phosphosilicate glass, or the like, or a combination thereof. In some embodiments, the lower passivation layer 105a may be designated as part of the inter-layer dielectric layers and/or the inter-metal dielectric layers of the first circuit layer 103a.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

In some embodiments, the lower passivation layer 105a may be formed by, for example, spin-coating, lamination, deposition, or the like. The deposition may include chemical vapor deposition such as plasma-enhanced chemical vapor deposition. The process temperature of the plasma-enhanced chemical vapor deposition may be between about 350° C. and about 450° C. The process pressure of the plasma-enhanced chemical vapor deposition may be between about 2.0 Torr and about 2.8 Torr. The process duration of the plasma-enhanced chemical vapor deposition may be between about 8 seconds and about 12 seconds.

In some embodiments, a plurality of via openings (not shown for clarity) may be formed along the lower passivation layer 105a to expose the plurality of center power pads 301a, the plurality of edge power pads 303a, the plurality of assisted power pads 305a, and the plurality of center data pads 307a. In some embodiments, the sidewalls of the plurality of via openings may be substantially vertical. In some embodiments, the sidewalls of the plurality of via openings may be tapered. It should be noted that, in the description of the present disclosure, a surface is "substantially vertical" if there exists a vertical plane from which the surface does not deviate by more than three times the root mean square roughness of the surface.

A conductive material may be formed to fill the plurality of via openings. The conductive material may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. A planarization process, such as chemical mechanical polishing, may be performed to remove excess material, provide a substantially flat surface for subsequent processing steps, and concurrently form the plurality of center power vias 401a, the plurality of edge power vias 403a, the plurality of assisted vias 405a, and the plurality of center data vias 407a.

The plurality of center power vias 401a may be electrically coupled to the plurality of center power pads 301a. The plurality of edge power vias 403a may be electrically coupled to the plurality of edge power pads 303a. The plurality of assisted vias 405a may be electrically coupled to the plurality of assisted power pads 305a. The plurality of center data vias 407a may be electrically coupled to the plurality of center data pads 307a.

In some embodiments, a plurality of barrier layers (not shown for clarity) may be formed between the aforementioned vias and pads. For example, a barrier layer may be formed between the center power pad 301a and the center power via 401a. The barrier layer may include aluminum fluoride. Due to saturated bonding property of aluminum fluoride, it is stable and may prevent the underlying pad from corrosion from various semiconductor processes, especially those processes including fluorine ions. The barrier layer may be formed by a sputtering process. The source of the sputtering process may include aluminum and sulfur hexafluoride or fluorine. The sulfur hexafluoride or fluorine may be decomposed in plasma and provides the fluorination sources such as fluoride ions and fluoride radicals to react with deposited films.

In some embodiments, the barrier layer may further include zinc oxide which may increase electrical properties of the barrier layer. In some embodiments, the content of zinc oxide may be greater than the content of aluminum fluoride. In some embodiments, the source of the sputtering process may include zinc oxide and aluminum fluoride. The ratio of the sputtering power of zinc oxide and the sputtering power of aluminum fluoride may be about 100 W:75 W.

Figure 9:
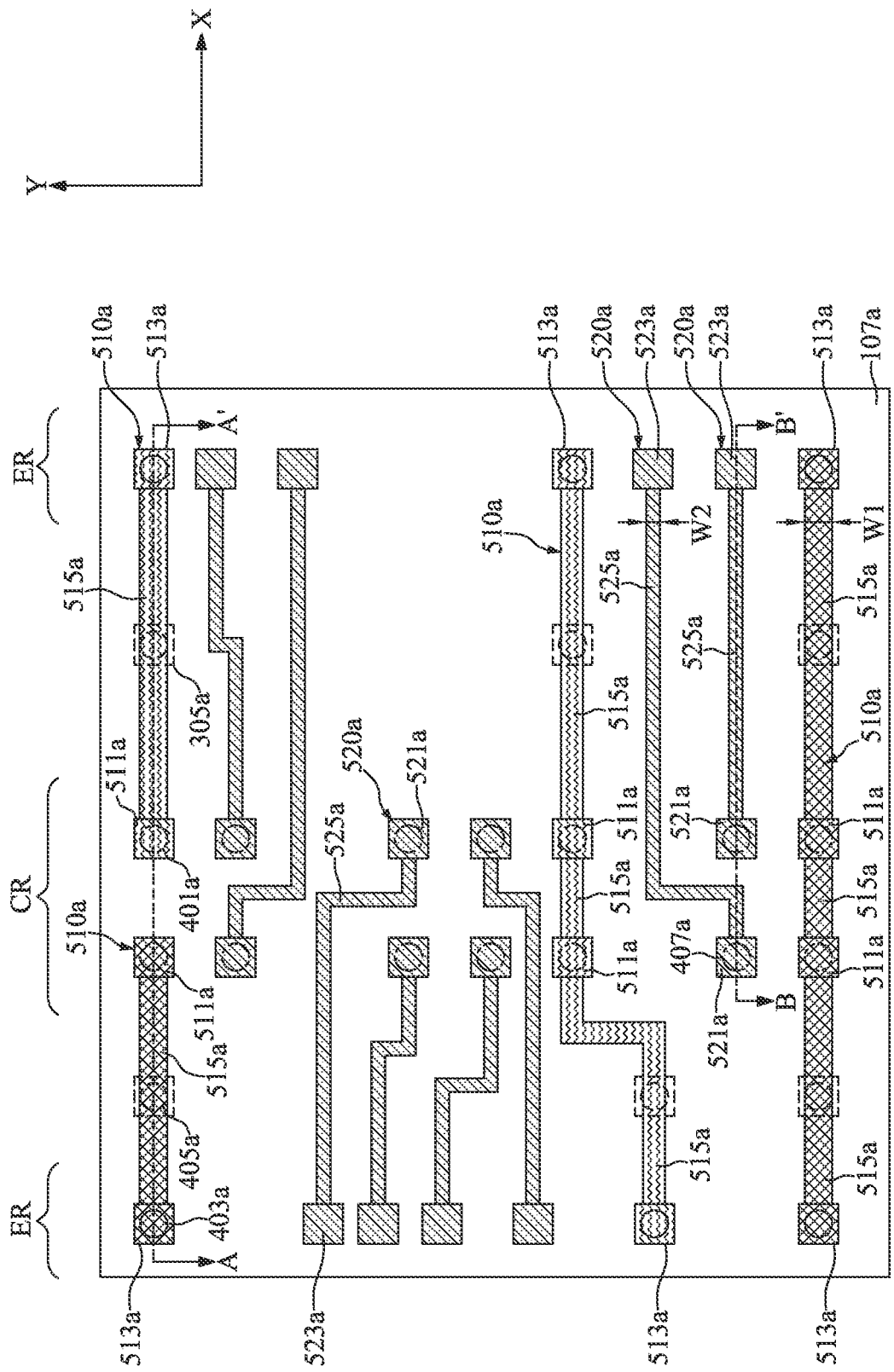
FIG. 9 illustrates, in a schematic top-view diagram, an intermediate semiconductor device in accordance with one embodiment of the present disclosure.
Figure 10:
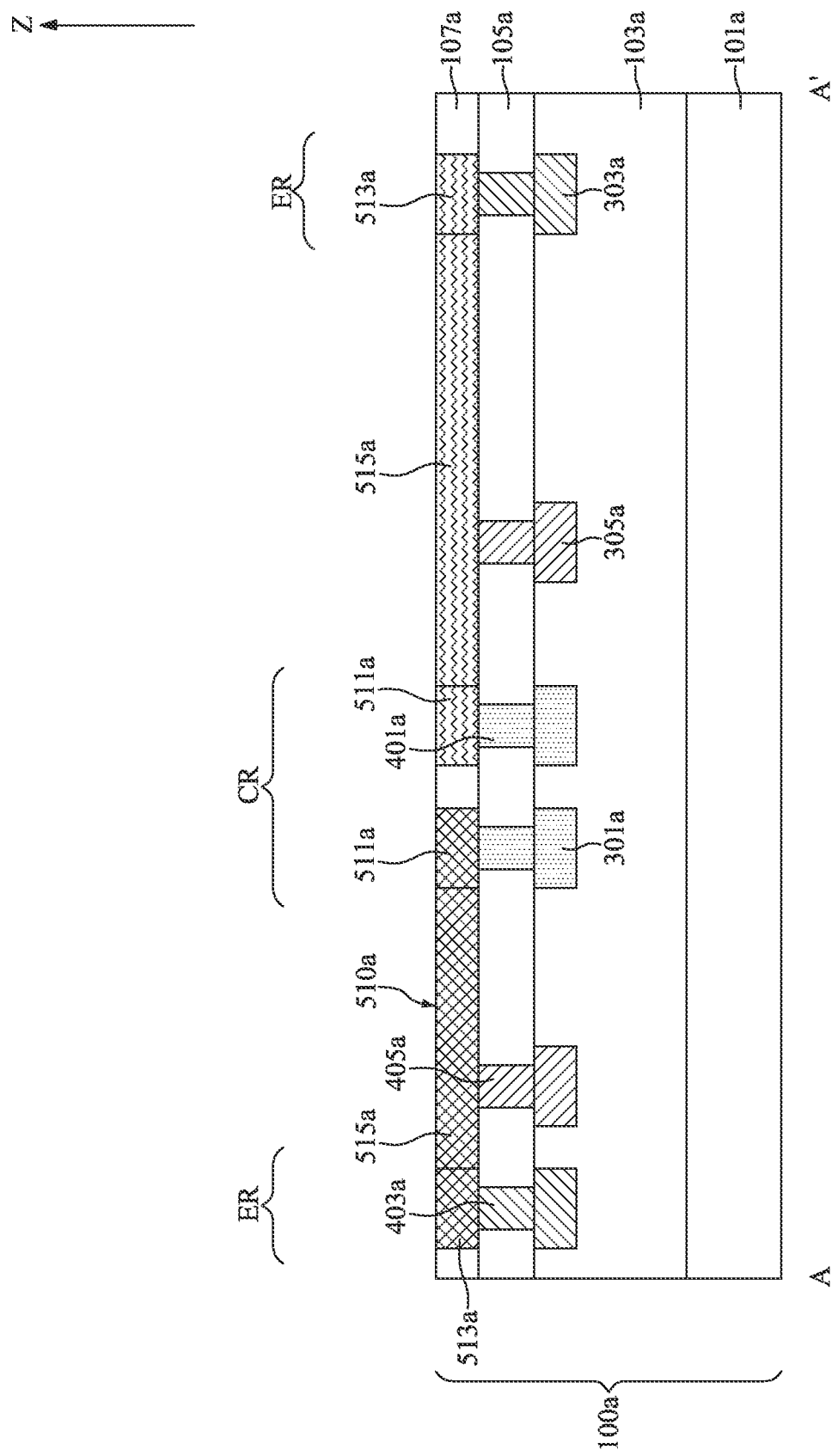
FIGS. 10 and 11 are schematic cross-sectional view diagrams taken along lines A-A' and B-B' in FIG. 9.
Figure 11:
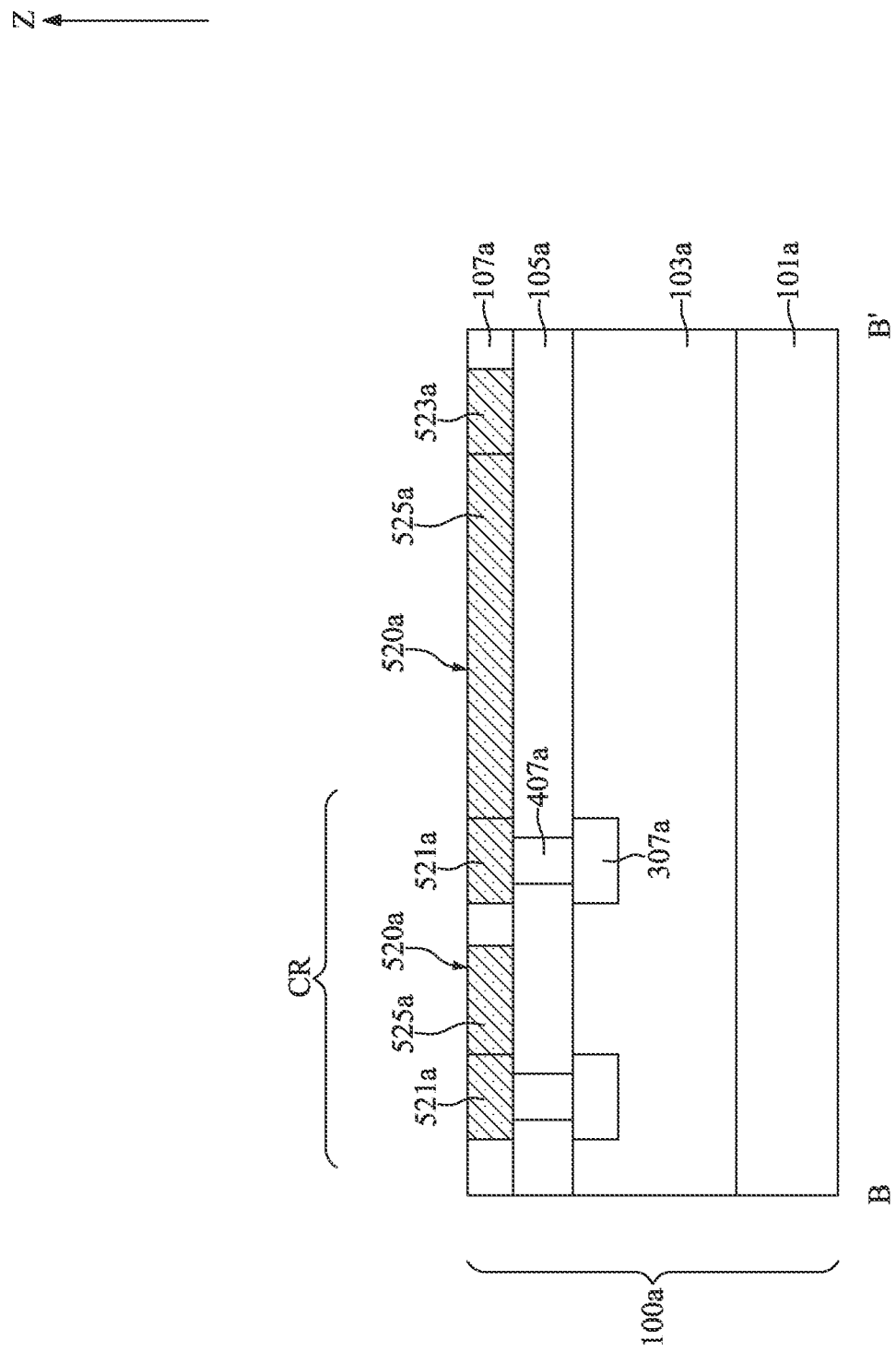
Figure 12:
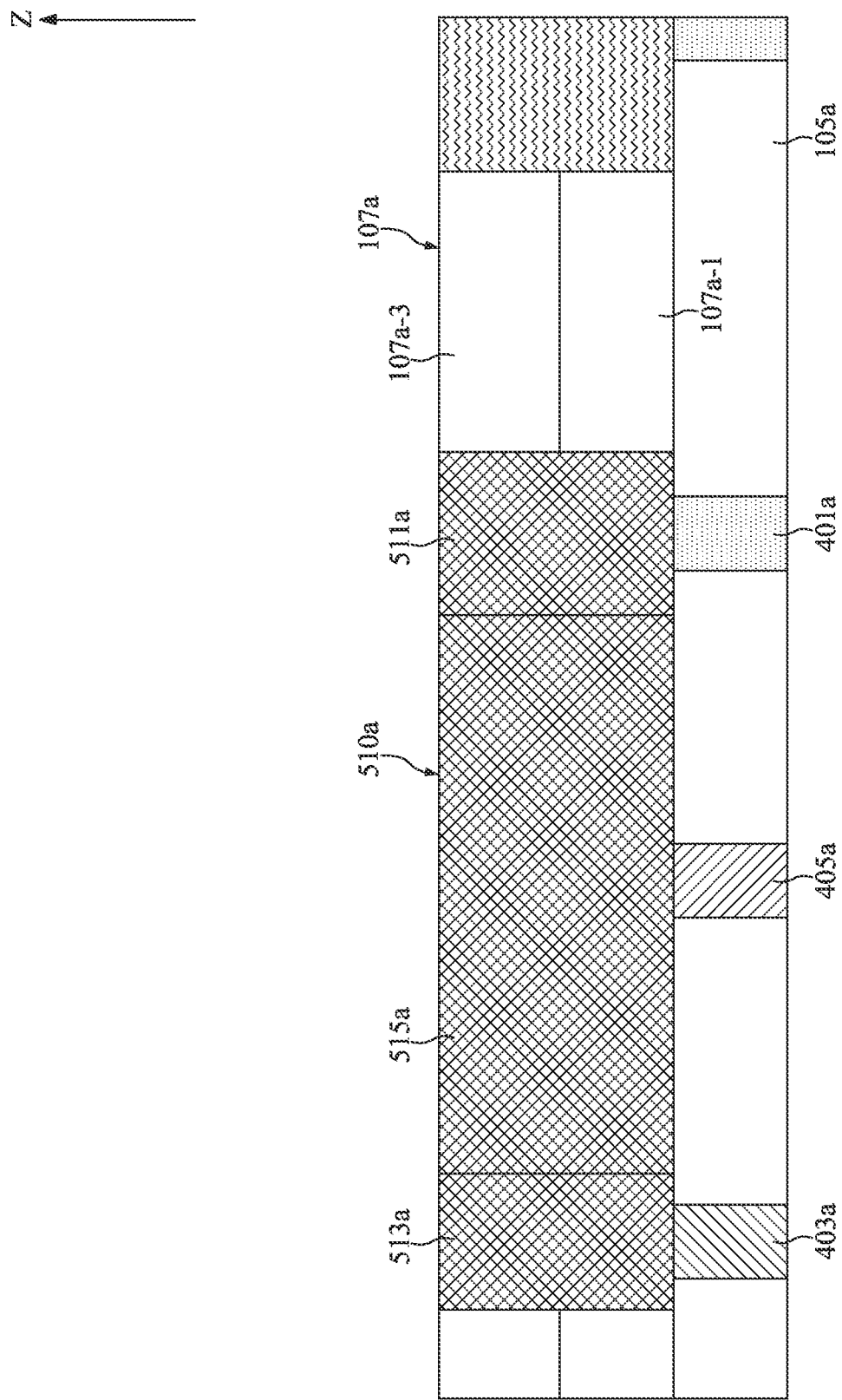
FIG. 12 illustrates, in a close-up schematic cross-sectional view diagram, an intermediate semiconductor device in accordance with one embodiment of the present disclosure.

FIG. 9 illustrates, in a schematic top-view diagram, an intermediate semiconductor device in accordance with one embodiment of the present disclosure. FIGS. 10 and 11 are schematic cross-sectional view diagrams taken along lines A-A' and B-B' in FIG. 9. FIG. 12 illustrates, in a close-up schematic cross-sectional view diagram, an intermediate semiconductor device in accordance with one embodiment of the present disclosure.

With reference to FIG. 1 and FIGS. 9 to 12, at step S15, a plurality of redistribution power patterns 510a may be formed to electrically couple to the plurality of center power vias 401a, the plurality of edge power vias 403a, and the plurality of assisted vias 405a, and a plurality of redistribution data patterns 520a may be formed to electrically couple to the plurality of center data vias 407a.

For brevity, clarity, and convenience of description, only one redistribution power pattern 510a and one redistribution data pattern 520a are described.

With reference to FIGS. 9 to 11, the redistribution power pattern 510a may include a redistribution center power pad 511a, a redistribution edge power pad 513a, and a redistribution connection line 515a. The redistribution center power pad 510a may be formed on the lower passivation layer 105a, topographically aligned with and contacting the center power via 401a. The redistribution center power pad 511a may be electrically coupled to the center power pad 301a through the center power via 401a. In some embodiments, the redistribution center power pad 511a may be formed extending to the lower passivation layer 105a and may directly contact the center power pad 301a while the center power via 401a is omitted.

The redistribution edge power pad 513a may be formed on the lower passivation layer 105a, topographically aligned with and contacting the edge power via 403a. The redistribution edge power pad 513a may be electrically coupled to the edge power pad 303a through the edge power via 403a. In some embodiments, the redistribution edge power pad 513a may be formed extending to the lower passivation layer 105a and may directly contact the edge power pad 303a while the edge power via 403a is omitted. The redistribution edge power pad 513a may be used for wiring or bumping to electrically couple the semiconductor device 1A to an external device.

The redistribution connection line 515a may be formed on the lower passivation layer 105a and contacting the assisted via 405a. The redistribution connection line 515a may be electrically coupled to the assisted power pad 305a through the assisted via 405a. The redistribution connection line 515a may connect the redistribution center power pad 511a and the redistribution edge power pad 513a. In some embodiments, the redistribution connection line 515a may be line-shaped and may re-route the redistribution center power pad 511a from the center region CR to the edge region ER to electrically connect to the redistribution edge power pad 513a. In some embodiments, the redistribution connection line 515a may connect two adjacent redistribution center power pads 511a above the center region CR.

With reference to FIGS. 9 to 11, the redistribution data patterns 520a may include a redistribution center data pad 521a, a redistribution edge data pad 523a, and a redistribution data line 525a. The redistribution center data pad 521a may be formed on the lower passivation layer 105a, topographically aligned with and contacting the center data via 407a. The redistribution center data pad 521a may be electrically coupled to the center data pad 307a through the center data via 407a. In some embodiments, the redistribution center data pad 521a may be formed extending to the lower passivation layer 105a and may directly contact the center data pad 307a while the center data via 407a is omitted.

The redistribution edge data pad 523a may be formed on the lower passivation layer 105a and above the edge region ER. The redistribution edge data pad 523a may be used for wiring or bumping to electrically couple the semiconductor device 1A to an external device. It should be noted that no via directly contacts the redistribution edge data pad 523a.

The redistribution data line 525a may be formed on the lower passivation layer 105a. The redistribution data line 525a may connect the redistribution center data pad 521a and the redistribution edge data pad 523a. In some embodiments, the redistribution data line 525a may be line-shaped and may re-route the redistribution center data pad 521a from the center region CR to the edge region ER to electrically connect to the redistribution edge data pad 523a. It should be noted that no via directly contacts the redistribution data line 525a.

With reference to FIGS. 9 to 11, the redistribution power pattern 510a may be employed as a power line. For example, in a top-view perspective, the redistribution power pattern 510a located at the top-left corner of the first substrate 101a may be electrically coupled to an external power source and the redistribution power pattern 510a located at the top-right corner of the first substrate 101a may be grounded. For another example, the redistribution power pattern 510a located at bottom of the first substrate 101a may be electrically coupled to an external power source and the redistribution power pattern 510a located at middle of the first substrate 101a may be grounded. In some embodiments, the redistribution data patterns 520a may be employed as data line. In some embodiments, the width W1 of the redistribution connection line 515a may be greater than the width W2 of the redistribution data line 525a. The redistribution power pattern 510a and the redistribution data patterns 520a may re-route the center power pad 301a and the center data pad 307a to gain more space for wiring or bumping and prevent the center power pad 301a and the center data pad 307a being affected by the stress of wiring or bumping.

With reference to FIGS. 9 to 11, an upper passivation layer 107a may be formed on the lower passivation layer 105a. The redistribution power pattern 510a and the redistribution data patterns 520a may be formed in the upper passivation layer 107a. The upper passivation layer 107a may include polybenzoxazole, polyimide, benzocyclobutene, ajinomoto buildup film, solder resist film, the like, or a combination thereof. The upper passivation layer 107a formed of polymeric material may have a number of attractive characteristics such as the ability to fill openings of high aspect ratio, a relatively low dielectric constant (about 3.2), a simple depositing process, the reduction of sharp features or steps in the underlying layer, and high temperature tolerance after curing. In some other embodiments, the upper passivation layer 107a may be a dielectric layer. The dielectric layer may include a nitride such as silicon nitride, an oxide such as silicon oxide, an oxynitride such as silicon oxynitride, silicon nitride oxide, phosphosilicate glass, borosilicate glass, boron-doped phosphosilicate glass, or the like, or a combination thereof.

In some embodiments, the formation of the redistribution power pattern 510a and the redistribution data pattern 520a may include forming one or more insulation layers (i.e., the upper passivation layer 107a) using any suitable method (e.g., a spin-on coating technique, sputtering, and the like) and forming conductive features in the insulation layers. The formation of the conductive features may include patterning the insulation layers (e.g., using photolithography and/or etching processes) and forming conductive features in the patterned insulation layers (e.g., by depositing a seed layer, using a mask layer to define the shape of the conductive features, and using an electroless/electrochemical plating process).

In some embodiments, a conductive blanket layer (not shown for clarity) may be formed on the lower passivation layer 105a. A photoresist layer (not shown for clarity) may be deposited on the conductive blanket layer and be subsequently patterned to expose the region where the redistribution power pattern 510a and the redistribution data patterns 520a to be formed. A conductive material may be formed into the region to form the redistribution power pattern 510a and the redistribution data patterns 520a. In some embodiments, the redistribution power pattern 510a and the redistribution data patterns 520a may be formed of for example, tungsten, titanium, tin, nickel, copper, gold, aluminum, platinum, cobalt, or a combination thereof.

With reference to FIGS. 9 to 11, the first substrate 101a, the first circuit layer 103a, the lower passivation layer 105a, the upper passivation layer 107a, the plurality of center power pads 301a, the plurality of edge power pads 303a, the plurality of assisted power pads 305a, the plurality of center data pads 307a, the plurality of center power vias 401a, the plurality of edge power vias 403a, the plurality of assisted vias 405a, the plurality of center data vias 407a, the plurality of redistribution power patterns 510a, and the plurality of redistribution data patterns 520a together configure a first semiconductor die 100a.

With reference to FIG. 12, in some embodiments, the upper passivation layer 107a may be a multi-layer structure. For example, the upper passivation layer 107a may include a bottom layer 107a-1 and a top layer 107a-3. The bottom layer 107a-l may be formed on the lower passivation layer 105a and may be formed of a nitride such as silicon nitride, an oxide such as silicon oxide, an oxynitride such as silicon oxynitride, silicon nitride oxide, phosphosilicate glass, borosilicate glass, boron-doped phosphosilicate glass, or the like, or a combination thereof. The top layer 107a-3 may be formed on the bottom layer 107a-1 and may be formed of polybenzoxazole, polyimide, benzocyclobutene, ajinomoto buildup film, solder resist film, the like, or a combination thereof. The redistribution power pattern 510a and the redistribution data patterns 520a may be formed along the bottom layer 107a-1 and the top layer 107a-3.

Conventionally, the power delivery to the center power pad 301 through the redistribution edge power pad 513a, the redistribution connection line 515a, and the redistribution center power pad 511a may be not enough instantaneously when the edge power via 403a and the assisted via 405a are not present. The insufficiency of power delivery is caused by parasitic inductance, parasitic capacitance, and extra resistance induced by additional delivery path of the redistribution power pattern 510a.

In contrast, in the present disclosure, the presence of the edge power via 403a and the assisted via 405a may provide alternative paths to deliver power to conductive features (e.g., the edge power pad 303a and the assisted power pad 305a) electrically coupled to the center power pad 301a. Therefore, the effect of insufficiency of power delivery may be alleviated. As a result, the performance of the semiconductor device 1A may be improved.

Figure 13:
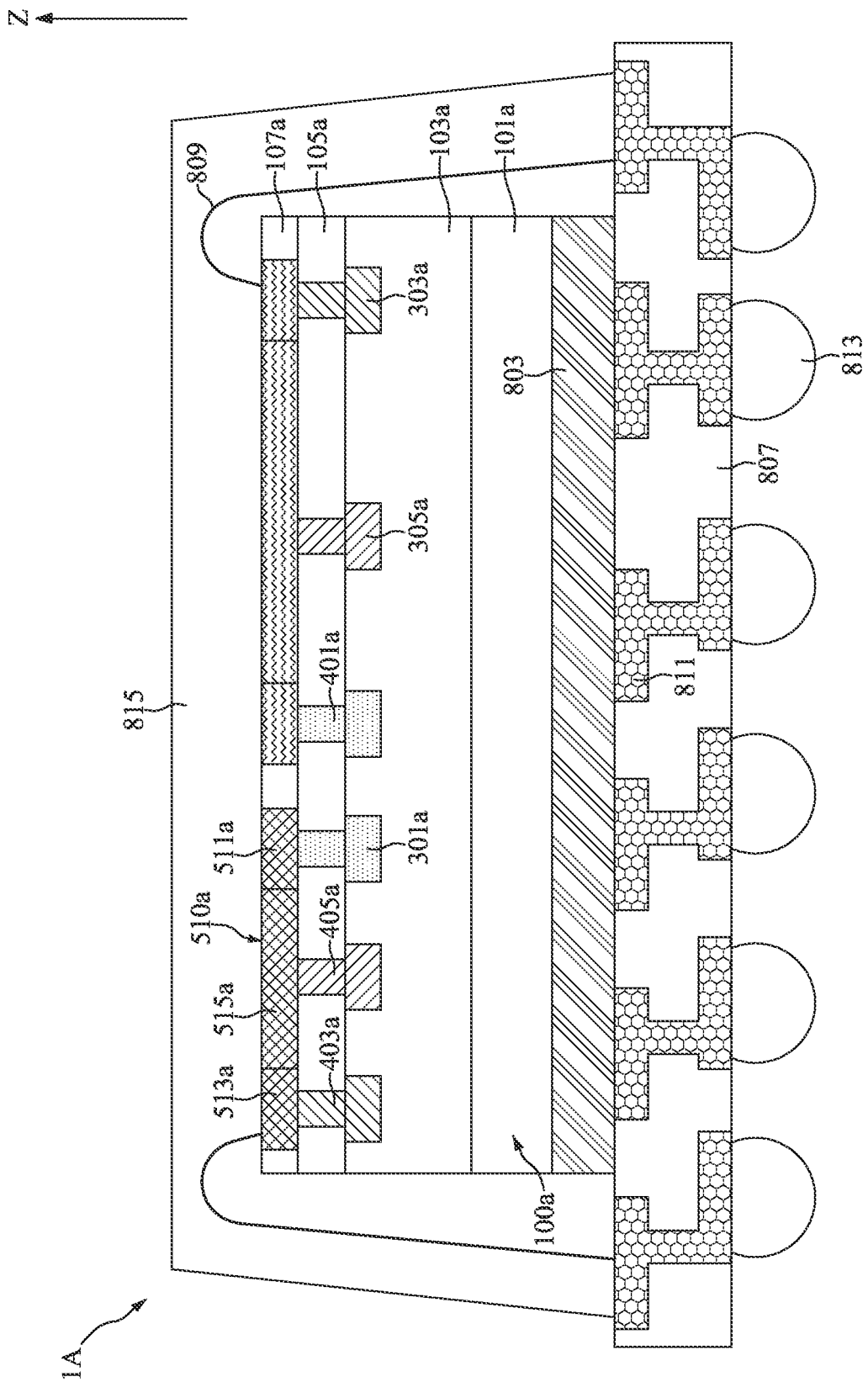
FIGS. 13 to 16 illustrate, in schematic cross-sectional view diagrams, semiconductor devices in accordance with some embodiments of the present disclosure.

FIG. 13 illustrates, in a schematic cross-sectional view diagram, part of a flow for fabricating the semiconductor device 1A in accordance with one embodiment of the present disclosure.

With reference to FIGS. 1 and 13, at step S17, a package substrate 807 may be attached to the first substrate 101a by a first attachment layer 803, a plurality of conductors 813 may be formed below the package substrate 807, a plurality of wires 809 may electrically couple the plurality of redistribution power patterns 510*a* and the plurality of redistribution data patterns 520*a* (not shown) to corresponding conductive lines 811 in the package substrate 807, and an encapsulation layer 815 may be formed over the package substrate 807.

With reference to FIG. 13, the first attachment layer 803 may be die attach film, silver paste, or the like. In some embodiments, the first attachment layer 803 may further include gold, silver, alumina, or boron nitride particles. In some embodiments, attaching the first semiconductor die 100*a* to the package substrate 807 may include the following processes: an adhesive material layer may be formed below the first substrate 101*a*. The adhesive material layer may include a flowable material. The first semiconductor die 100*a* with the adhesive material layer may be bonded onto the package substrate 807. Thereafter, a curing process may be subsequently performed, such that the adhesive material layer may be cross-linked and cured to form the first attachment layer 803.

With reference to FIG. 13, the plurality of conductors 813 may include a conductive material with low resistivity, such as tin, lead, silver, copper, nickel, bismuth or an alloy thereof. The plurality of wires 809 may be formed to electrically couple the redistribution edge power pad 513*a* and the redistribution edge data pad 523*a* to corresponding conductive lines 811 in the package substrate 807, respectively. The plurality of wires 809 may be formed of, for example, gold. The plurality of wires 809 may be formed through ball-wedge process or wedge-wedge process by using ultrasonic bonding, thermosonic bonding, or thermocompression bonding.

With reference to FIG. 13, the encapsulation layer 815 may be formed over the package substrate 807 to cover the first semiconductor die 100*a* and the plurality of wires 809. The encapsulation layer 815 may be formed of a molding compound such as polybenzoxazole, polyimide, benzocyclobutene, epoxy laminate, or ammonium bifluoride. The encapsulation layer 815 may be formed by compressive molding, transfer molding, liquid encapsulant molding, and the like. For example, a molding compound may be dispensed in liquid form. Subsequently, a curing process is performed to solidify the molding compound. The formation of molding compound may overflow the first semiconductor die 100*a* so that molding compound covers the first semiconductor die 100*a*. A planarization process such as mechanical grinding, chemical mechanical polish, or other etch back technique may be employed to remove excess portions of the molding compound and provide a substantially flat surface.

Figure 14:
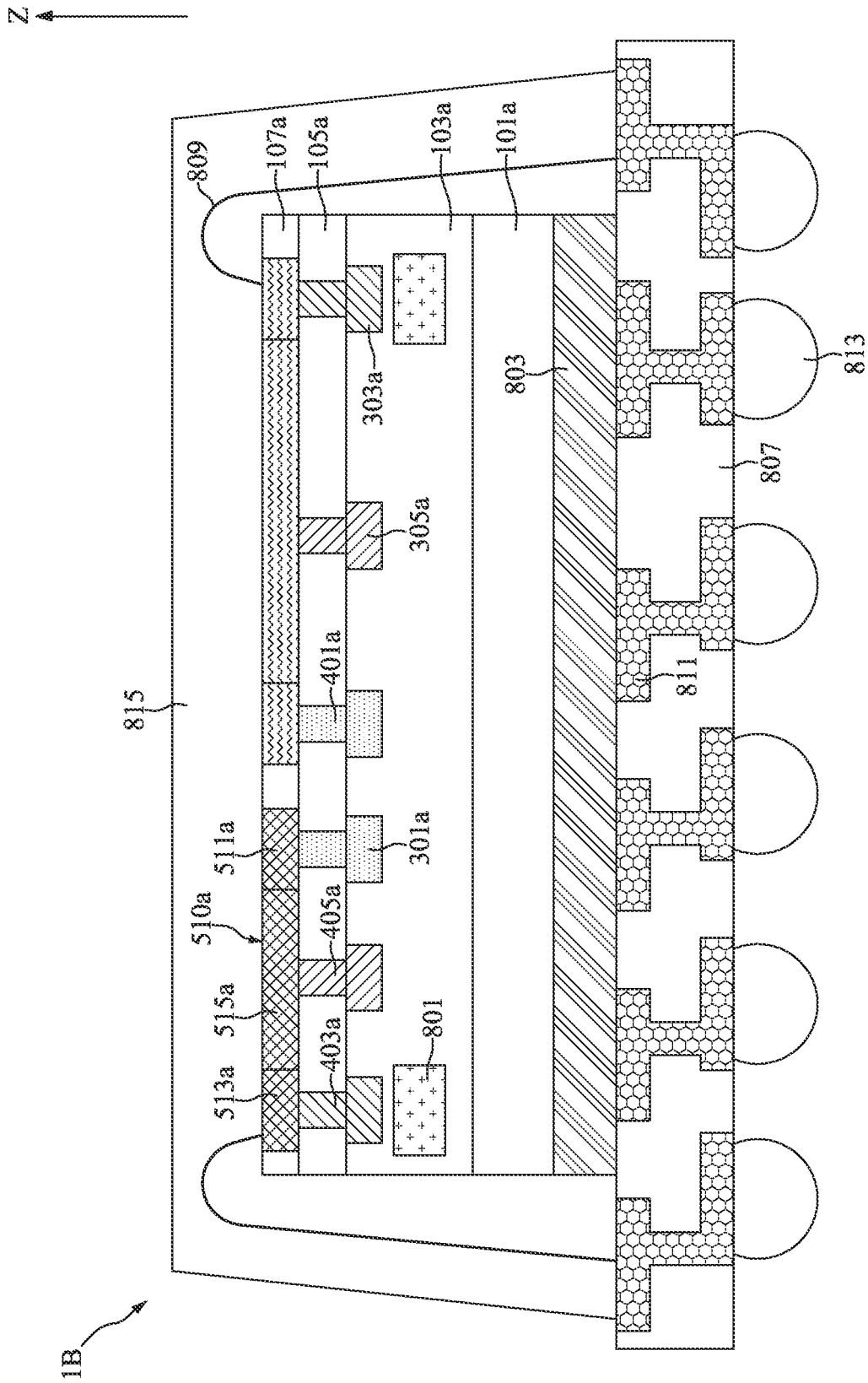
Figure 15:
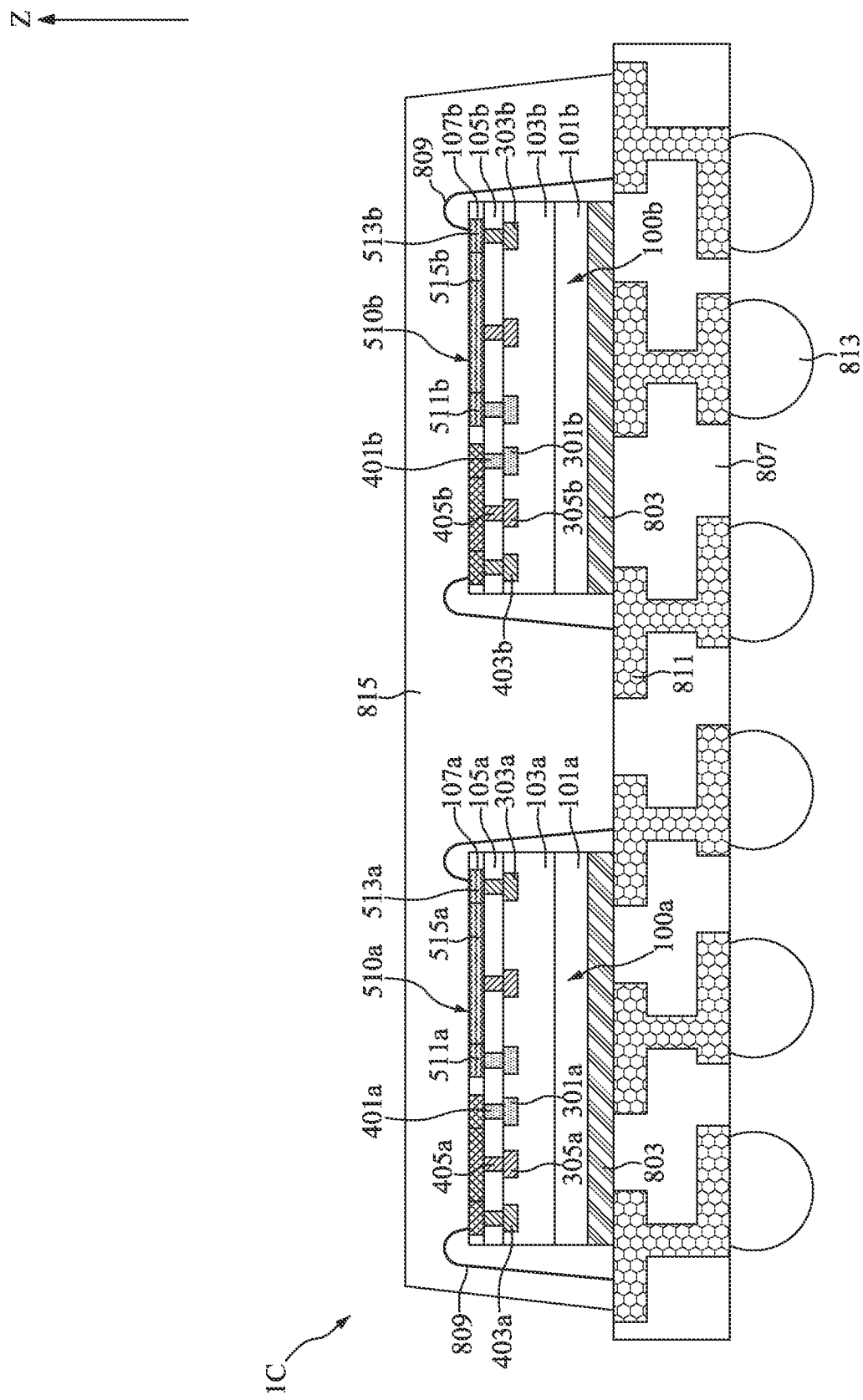
Figure 16:
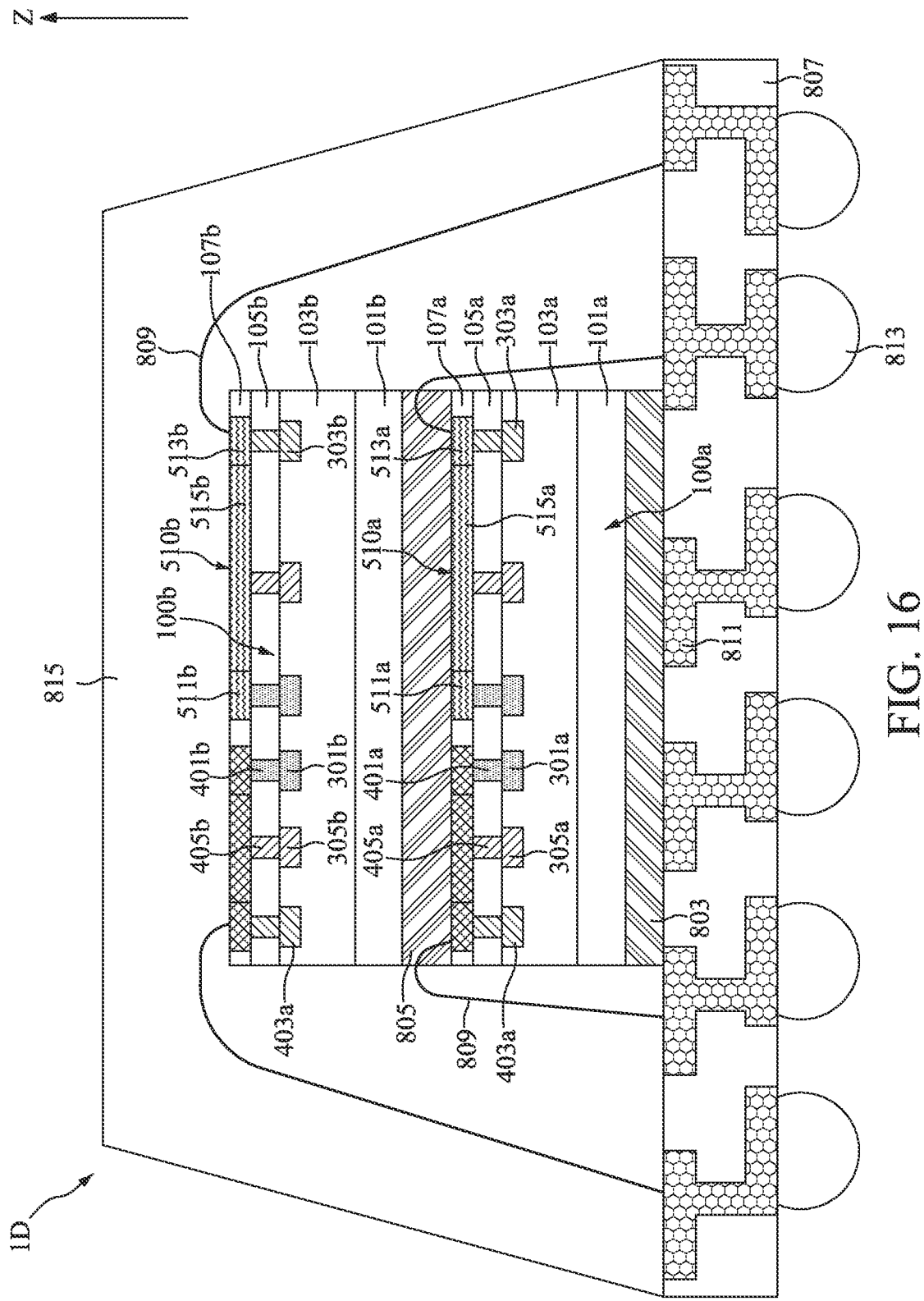

FIGS. 14 to 16 illustrate, in schematic cross-sectional view diagrams, semiconductor devices 1B, 1C, and 1D in accordance with some embodiments of the present disclosure.

With reference to FIG. 14, the semiconductor device 1B may have a structure similar to that illustrated in FIG. 13. The same or similar elements in FIG. 14 as in FIG. 13 have been marked with similar reference numbers and duplicative descriptions have been omitted.

The semiconductor device 1B may include plurality of cushion layers 801. For brevity, clarity, and convenience of description, only one cushion layer 801 is described.

The cushion layer 801 may be disposed in the first circuit layer 103*a* and topographically aligned with the redistribution edge power pad 513*a*. The cushion layer 801 may be at a vertical level lower than a vertical level of the edge power pad 303*a*. In some embodiments, the cushion layer 801 and the edge power pad 303*a* may not contact each other. The cushion layer 801 may be utilized to absorb and redistribute the stress concentrated on the underlying layers created by the shear stresses from thermal expansion mismatches and normal stresses due to a wiring process or bumping process. The cushion layer 801 may be formed of for example, a material having a coefficient of thermal expansion of less than about 20 ppm/° C. and a Young's Modulus of less than about 15 GPa. Specifically, the cushion layer 801 may be formed of a material including polyimide or an epoxy-based material. The cushion layer 801 may have a thickness between about 500 nm and about 10000 nm. Preferably, the thickness of the cushion layer 801 may be between about 1000 nm and about 5000 nm. The cushion layer 801 may serve as a cushion to reduce a stress of a bumping process or a wiring process; therefore, the delamination of the upper passivation layer 107*a*, the lower passivation layer 105*a*, or the upper portion of the first circuit layer 103*a* may be reduced.

With reference to FIG. 15, the semiconductor device 1C may have a structure similar to that illustrated in FIG. 13. The same or similar elements in FIG. 15 as in FIG. 13 have been marked with similar reference numbers and duplicative descriptions have been omitted.

The semiconductor device 1C may include a second semiconductor die 100*b*. The second semiconductor die 100*b* may be disposed next to the first semiconductor die 100*a*. The second semiconductor die 100*b* may be attached onto the package substrate 807 by the first attachment layer 803. The plurality of wires 809 may electrically couple the second semiconductor die 100*b* to corresponding conductive lines 811 in the package substrate 807. The encapsulation layer 815 may cover the first semiconductor die 100*a* and the second semiconductor die 100*b*.

In some embodiments, the second semiconductor die 100*b* may have a layout which is different from the layout of the first semiconductor die 100*a*. In some embodiments, the second semiconductor die 100*b* may have a layout which is the same as the layout of the first semiconductor die 100*a*. In some embodiments, the first semiconductor die 100*a* and the second semiconductor die 100*b* may provide a same functionality but are not limited thereto.

In some embodiments, the second semiconductor die 100*b* may include a second substrate 101*b*, a second circuit layer 103*b*, a lower passivation layer 105*b*, a upper passivation layer 107*b*, a plurality of center power pads 301*b*, a plurality of edge power pads 303*b*, a plurality of assisted power pads 305*b*, a plurality of center data pads 307*b*, a plurality of center power vias 401*b*, a plurality of edge power vias 403*b*, a plurality of assisted vias 405*b*, and a redistribution power pattern 510*a* respectively including a redistribution center power pad 511*b*, a redistribution edge power pad 513*b*, and a redistribution connection line 515*b*. The aforementioned features of the second semiconductor die 100*b* may have structure similar to corresponding features of the first semiconductor die 100*a*, and descriptions thereof are not repeated herein.

With reference to FIG. 16, the semiconductor device 1D may have a structure similar to that illustrated in FIG. 13. The same or similar elements in FIG. 16 as in FIG. 13 have been marked with similar reference numbers and duplicative descriptions have been omitted.

The semiconductor device 1D may include a second semiconductor die 100*b*. The second semiconductor die 100*b* may be disposed above the first semiconductor die 100*a*. The second semiconductor die 100*b* may be attached onto the first semiconductor die 100a by a second attachment layer 805. The second attachment layer 805 may be die attach film, silver paste, or the like. In some embodiments, the second attachment layer 805 may further include gold, silver, alumina, or boron nitride particles. In some embodiments, attaching the second semiconductor die 100b to the first semiconductor die 100a may include the following processes: an adhesive material layer may be formed below the second semiconductor die 100b. The adhesive material layer may include a flowable material. The second semiconductor die 100b with the adhesive material layer may be bonded onto the first semiconductor die 100a. Thereafter, a curing process may be subsequently performed, such that the adhesive material layer may be cross-linked and cured to form the second attachment layer 805.

The plurality of wires 809 may electrically couple the second semiconductor die 100b to corresponding conductive lines 811 in the package substrate 807. The encapsulation layer 815 may cover the first semiconductor die 100a and the second semiconductor die 100b. The second semiconductor die 100b may have a structure similar to that illustrated in FIG. 15, and descriptions thereof are not repeated herein.

In some embodiments, the first substrate 101a of the first semiconductor die 100a and/or the second substrate 101b of the second semiconductor die 100b may be thinned. This thinning allows for improved thermal dissipation and provides for a lower package profile.

One aspect of the present disclosure provides a semiconductor device including a first substrate including a center region and an edge region distal from the center region, a first circuit layer positioned on the first substrate, a center power pad positioned in the first circuit layer and above the center region, an edge power pad positioned in the first circuit layer, above the edge region, and electrically coupled to the center power pad, a redistribution power pattern positioned above the first circuit layer and electrically coupled to the center power pad, and an edge power via positioned between the edge power pad and the redistribution power pattern, and electrically connecting the edge power pad and the redistribution power pattern. The first substrate, the center power pad, the edge power pad, the redistribution power pattern, and the edge power via together configure a first semiconductor die.

Another aspect of the present disclosure provides a method for fabricating a semiconductor device including providing a first substrate including a center region and an edge region distal from the center region, forming a first circuit layer on the first substrate, forming a center power pad in the first circuit layer and above the center region, forming an edge power pad in the first circuit layer, above the edge region, and electrically coupled to the center power pad, forming an edge power via on the edge power pad, and forming a redistribution power pattern on the edge power via and electrically coupled to the center power pad. The first substrate, the center power pad, the edge power pad, the redistribution power pattern, and the edge power via together configure a first semiconductor die.

Due to the design of the semiconductor device of the present disclosure, the insufficiency of power delivery may be alleviated by the edge power via 403a and the assisted via 405a. As a result, the performance of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a first substrate comprising a center region and an edge region distal from the center region;
a first circuit layer positioned on the first substrate;
a center power pad positioned in the first circuit layer and above the center region;
an edge power pad positioned in the first circuit layer, above the edge region, and electrically coupled to the center power pad;
a redistribution power pattern positioned above the first circuit layer and electrically coupled to the center power pad;
an edge power via positioned between the edge power pad and the redistribution power pattern, and electrically connecting the edge power pad and the redistribution power pattern; and
an assisted power pad and an assisted via;
wherein the first substrate, the center power pad, the edge power pad, the redistribution power pattern, and the edge power via together configure a first semiconductor die;
wherein the redistribution power pattern comprising:
a redistribution center power pad positioned above the first circuit layer, topographically aligned with the center power pad, and electrically coupled to the center power pad;
a redistribution edge power pad positioned above the first circuit layer, topographically aligned with the edge power pad, and electrically coupled to the edge power pad through the edge power via; and
a redistribution connection line connecting the redistribution center power pad and the redistribution edge power pad;
wherein the assisted power pad is positioned in the first circuit layer, positioned between the center power pad and the edge power pad, and electrically coupled to the center power pad;
wherein the assisted via electrically connects the redistribution connection line and the assisted power pad.

2. The semiconductor device of claim 1, further comprising a lower passivation layer positioned on the first circuit layer;
wherein the edge power via and the assisted via are positioned in the lower passivation layer.

3. The semiconductor device of claim 2, further comprising an upper passivation layer positioned on the lower passivation layer;

wherein the redistribution power pattern is positioned in the upper passivation layer.

4. The semiconductor device of claim 3, further comprising a package substrate positioned below the first substrate.

5. The semiconductor device of claim 4, further comprising a first attachment layer positioned between the package substrate and the first substrate and connecting the package substrate and the first substrate.

6. The semiconductor device of claim 5, further comprising a wire electrically connecting the redistribution edge power pad and a conductive line in the package substrate.

7. The semiconductor device of claim 5, wherein the redistribution edge power pad is electrically coupled to an external power source.

8. The semiconductor device of claim 5, further comprising a center data pad and a redistribution data pattern;
wherein the center data pad is positioned in the first circuit layer and above the center region;
wherein the redistribution data pattern comprises:
a redistribution center data pad positioned on the lower passivation layer, topographically aligned with the center data pad, and electrically coupled to the center data pad through a center data via;
a redistribution edge data pad positioned on the lower passivation layer and above the edge region; and
a redistribution data line connecting the redistribution center data pad and the redistribution edge data pad.

9. The semiconductor device of claim 8, wherein a width of the redistribution connection line is greater than a width of the redistribution data line.

10. The semiconductor device of claim 5, further comprising a cushion layer positioned in the first circuit layer and topographically aligned with the edge power pad.

11. The semiconductor device of claim 5, further comprising a second semiconductor die positioned next to the first semiconductor die;
wherein the second semiconductor die is attached on the package substrate through a first attachment layer.

12. The semiconductor device of claim 5, further comprising a second semiconductor die stacked on the first semiconductor die with a second attachment layer interposed therebetween.

13. The semiconductor device of claim 12, wherein a layout of the second semiconductor die and a layout of the first semiconductor die are substantially the same.

* * * * *